(12) United States Patent
Schulz et al.

(10) Patent No.: US 11,313,032 B2
(45) Date of Patent: Apr. 26, 2022

(54) LAYER SYSTEM AND COMPONENT

(71) Applicant: Schaeffler Technologies AG & Co. KG, Herzogenaurach (DE)

(72) Inventors: Edgar Schulz, Langensendelbach (DE); Ladislaus Dobrenizki, Höchstadt (DE); Ricardo Henrique Brugnara, Heßdorf (DE); Oliver Witter, Westhausen (DE)

(73) Assignee: Schaeffler Technologies AG & Co. KG, Herzogenaurach (DE)

(*) Notice: Subject to any disclaimer, the term of this patent is extended or adjusted under 35 U.S.C. 154(b) by 0 days.

(21) Appl. No.: 16/467,069

(22) PCT Filed: Dec. 4, 2017

(86) PCT No.: PCT/DE2017/101041
§ 371 (c)(1),
(2) Date: Jun. 6, 2019

(87) PCT Pub. No.: WO2018/141317
PCT Pub. Date: Aug. 9, 2018

(65) Prior Publication Data
US 2019/0338409 A1 Nov. 7, 2019

(30) Foreign Application Priority Data
Feb. 2, 2017 (DE) .................. 10 2017 102 059.4

(51) Int. Cl.
*C23C 14/06* (2006.01)
*C23C 14/16* (2006.01)

(52) U.S. Cl.
CPC ........ *C23C 14/165* (2013.01); *C23C 14/0641* (2013.01)

(58) Field of Classification Search
CPC combination set(s) only.
See application file for complete search history.

(56) References Cited

U.S. PATENT DOCUMENTS

| 5,593,234 A | 1/1997 | Liston |
| 7,211,323 B2 | 5/2007 | Erdemir et al. |
| 2005/0170162 A1* | 8/2005 | Yamamoto ............ C23C 28/341 428/216 |
| 2013/0029119 A1 | 1/2013 | Chen |

(Continued)

FOREIGN PATENT DOCUMENTS

| CN | 101254674 A | 9/2008 |
| CN | 102181835 B | 10/2012 |

(Continued)

OTHER PUBLICATIONS

Fluck, "New Notations in the Periodic Table", 1988, Pure & Applied Chemistry, vol. 60, No. 3, p. 431-436. (Year: 1988).*

(Continued)

*Primary Examiner* — Seth Dumbris
*Assistant Examiner* — Kim S. Horger
(74) *Attorney, Agent, or Firm* — Kevin Parks

(57) ABSTRACT

A layer system includes at least one bonding layer and a plurality of functional layers arranged on the at least one bonding layer. Each functional layer has a first nanolayer of a first metal nitride with a first metal constituent, and a metallic second nanolayer. Each functional layer has a layer thickness d in a range of 1 to 100 nm.

14 Claims, 2 Drawing Sheets

(56) References Cited

U.S. PATENT DOCUMENTS

| | | |
|---|---|---|
| 2013/0221621 A1 | 8/2013 | Araujo |
| 2014/0050932 A1* | 2/2014 | Gierl .................. C23C 16/26 428/457 |
| 2016/0230274 A1 | 8/2016 | Flannery |

FOREIGN PATENT DOCUMENTS

| | | |
|---|---|---|
| CN | 103459617 A | 12/2013 |
| DE | 3503105 A1 | 7/1986 |
| DE | 102011006294 A1 | 10/2012 |
| DE | 102014016983 A1 | 5/2016 |
| JP | H0625826 A | 2/1998 |
| JP | H6346224 A | 11/2002 |
| JP | 2010084202 A | 4/2010 |
| JP | 2014136836 A | 7/2014 |
| JP | 2015528531 A | 9/2015 |
| JP | 2015230086 A | 12/2015 |
| JP | 2016112895 A | 6/2016 |
| WO | 2012078151 A1 | 6/2012 |

OTHER PUBLICATIONS

Yang et al., "CrN-based wear resistant hard coatings for machining and forming tools", Apr. 30, 2009, Journal of Physics D: Applied Physics, vol. 42, p. 104001 (8 pgs). (Year: 2009).*

Yang et al., "A study of TiMoN nano-multilayer coatings deposited by CFUBMSIP using DC and HIPIMS power", 2012, Applied Surface Science, vol. 258, p. 2062-2067. (Year: 2012).*

Pappacena et al., "Residual Stresses, Interfacial Adhesion and Tribological Properties of MoN/Cu Composite Coatings", 2012, Wear, 278-279, p. 62-70. (Year: 2012).*

Zhang et al., "Microstructure, Mechanical and Tribological Properties of TiN/Mo2N Nano-multilayer Films Deposited by Magnetron Sputtering", 2015, Surface & Coatings Technology, vol. 261, p. 156-160. (Year: 2015).*

Kostenbauer et al., "Tribological Properties of TiN/Ag Nanocomposite Coatings", 2008, Tribol. Lett., vol. 30, p. 53-60. (Year: 2008).*

Author: Li Jingui et al. Source: Modern Surface Engineering Manual National Defense Industry Press Date: Sep. 30, 2000 Country: China.

* cited by examiner

LAYER SYSTEM AND COMPONENT

CROSS-REFERENCE TO RELATED APPLICATIONS

This application is the United States National Phase of PCT Appln. No. PCT/DE2017/101041 filed Dec. 4, 2017, which claims priority to German Application No. DE102017102059.4 filed Feb. 2, 2017, the entire disclosures of which are incorporated by reference herein.

TECHNICAL FIELD

The disclosure relates to a layer system including at least one bonding layer and a plurality of relative functional layers arranged on the at least one bonding layer. The disclosure furthermore relates to a component including a metallic substrate and such a layer system arranged on the substrate. In this case, the layer system is intended to serve as a wear protection layer.

BACKGROUND

Layer systems and components of this type are widely known. For instance, DE 10 2011 006 294 A1 discloses a method for producing a coated metal component. The layer system applied onto the metal component includes at least one inter alia metallic bonding layer and a functional layer. The functional layer is, for example, a nitridic hard material layer or a nanocomposite layer of a nitridic hard material and a metallic constituent, which is formed, for example, by an element of the $3^{rd}$ to $5^{th}$ main groups or the $1^{st}$ to $8^{th}$ subgroups of the periodic table of the chemical elements.

WO 2012/078151 A1 discloses nitridic wear protection layers and components coated therewith. The wear protection layer includes molybdenum nitride grains with a grain size in the range of from 5 to 100 nm distributed in a copper matrix, the copper matrix being present at 0.1 to 50 wt.-% in the wear protection layer and enclosing the individual molybdenum nitride grains.

It has been found that, although the composite layers described in the prior art, comprising a metal matrix and grains of a nitridic hard material embedded therein, form a wear protection layer, a sufficient reduction of the friction against a friction partner, in particular when using lubricants in the region of a contact face between the layer system and the friction partner, is not however achieved. While diamond-like layers, also referred to as DLC layers, both form a wear protection layer and ensure an efficient friction reduction against a friction partner, even with the use of lubricants, this is not observable in the same way with the described composite layers comprising a metal matrix and grains of a nitridic hard material embedded therein.

SUMMARY

The disclosure provides a layer system including at least one nitridic hard material, which both serves as a wear protection layer and leads to a friction reduction against the friction partner during frictional wear with the use of lubricant. The disclosure also provides a component which is coated at least partially with such a layer system.

Example embodiments include a layer system with:
at least one bonding layer; and
a plurality of functional layers arranged on the at least one bonding layer. Each functional layer includes a first nanolayer of a first metal nitride with a first metal constituent, and a metallic second nanolayer (3b, 4b, 5b, 6b). Each functional layer (3, 4, 5, 6) has a layer thickness d in the range of from 1 to 100 nm.

A "nanolayer" in the context of the disclosure is intended to mean a single layer which has a layer thickness in the range of from 0.1 to 99.9 nm. In this case, two nanolayers together form a functional layer with the layer thickness d. In particular, a layer thickness of a nanolayer lies in the range of from 1 to 20 nm.

It has surprisingly been found that the layer system according to the disclosure provides a high wear protection effect, and furthermore leads to a more effective reduction of the friction against a friction partner when using lubricants than when a composite layer as mentioned in the introduction is used.

A lubricant is in this case intended to mean lubricating oil, lubricating grease, waxes, solid lubricants and the like, as well as combinations thereof, as well as lubricating oils containing conventional engine additives.

The metallic second nanolayer may be formed from at least one metal of the $3^{rd}$ to $7^{th}$ subgroups of the periodic table of the chemical elements. The metallic second nanolayer may be formed from at least one metal from the group consisting of copper, palladium, silver, platinum, iridium, gold. In particular, the second nanolayer may be formed from copper, for example.

In an example embodiment, the at least one bonding layer includes a first bonding layer of a further metal or of a second metal nitride with a second metal constituent. In this case, the further metal or the second metal constituent may be selected to be the same or different to the first metal constituent of the first metal nitride of the first nanolayers. In particular, the first bonding layer may be formed from chromium, chromium-aluminum alloys, titanium, molybdenum or zirconium. As an alternative, the first bonding layer may be be formed from a chromium nitride CrN, titanium nitride TiN, CrAlN or molybdenum nitride MoN. The first bonding layer may have a layer thickness in the range of from 0.01 to 2 μm.

In an example embodiment, the at least one bonding layer may include a second bonding layer. The second bonding layer includes the first metal constituent of the first metal nitride provided in the functional layer and furthermore the further metal contained in the first bonding layer or the second metal constituent. The second bonding layer in this case may have a gradient profile, the proportion of the further metal or of the second metal constituent, which is contained in the first bonding layer, decreasing in the direction of the multiplicity of functional layers, and the proportion of the first metal component of the first metal nitride provided in the functional layer correspondingly increasing. The second bonding layer therefore produces a transition between the first bonding layer and the functional layer adjacent to the second bonding layer.

The second bonding layer may have a layer thickness in the range of from 0.01 to 2 μm. In this case, the first bonding layer, the second bonding layer and the plurality of functional layers may be arranged successively. In particular, a number n of functional layers in the range of from 10 to 10000, particularly preferably in the range of from 100 to 1000, may be present.

In one example embodiment, the layer system including the at least one bonding layer and the plurality of functional layers has a total layer thickness D in the range of from 0.1 μm to 10 μm. With such a total layer thickness, on the one hand excellent adhesion of the layer system on a substrate can be achieved together with short production times and low process costs, and on the other hand efficient wear protection and a friction reduction when using lubricants.

The first metal nitride of the first nanolayer may be formed by molybdenum nitride MoN. As an alternative, however, the first metal nitride may also be formed by a different nitridic hard material, such as CrN, $Cr_2N$, TaN, NbN, TiN, $Ti_2N$, ZrN, VN, AlN.

The first nanolayer of each functional layer to be configured may be thicker than the second nanolayer associated with the functional layer. In this way, the friction-reducing properties of the layer system can be improved. A sum of the functional layers of the layer system may have an average content of metal of the second nanolayer in the range of from 0.1 to 20 at.-%.

The layer system according to the disclosure may be formed by means of a PVD (PVD=Physical Vapor Deposition) method at temperatures below 350° C. The layer system may have, in particular, a Vickers hardness in the range of from 1000 to 4000 HV for wear protection.

Other example embodiments include a component with a metallic substrate and a layer system according to the disclosure at least partially arranged on a surface of the substrate. The at least one bonding layer, in particular the first bonding layer, is arranged adjacent to the substrate.

The metallic substrate may be formed from steel. In particular, steel types such as 16MnCr5, C45, 100Cr6, 31CrMoV9, 80Cr2, 42CrMo4 and the like are possible.

The component may be configured as a machine component, particularly in the form of a barrel tappet, a chain part, a rolling bearing part, a control piston, a bearing bush, a towing lever, a roller tappet part, a slide bearing part and the like.

In order to form the layer system in a PVD method (PVD=Physical Vapor Deposition), a sputtering apparatus may be used. In a first step, the at least one bonding layer is applied at least partially onto at least one substrate. In particular, a metallic first bonding layer, for example of chromium, is deposited on the surface of the at least one substrate. In this case, surface-wide or partial deposition of the first bonding layer on the substrate may be carried out.

Subsequently, a second bonding layer, in particular of chromium and molybdenum, is deposited on the first bonding layer. In this case, the chromium content may decrease starting from the first bonding layer in the direction of the functional layer. In order to form the functional layers, the substrates are for example arranged on a substrate holder, which can be rotated centrally about a vertical axis in a vacuum chamber of the sputtering apparatus. Arranged on mutually opposite side walls of the vacuum chamber, there are targets which are formed from different sputtering materials.

Here, the procedure is described by way of example with the aid of functional layers respectively including a first nanolayer of molybdenum nitride MoN and a second nanolayer of copper. At least one copper target is arranged on a first side wall of the vacuum chamber, and at least one molybdenum target is arranged on the opposite side wall. One or more substrates are arranged rotatably about the vertical axis on the substrate holder and in the vacuum chamber, in such a way that each alternately enters the region of influence of the at least one copper target and that of the at least one molybdenum target. Nitrogen is introduced into the vacuum chamber as a reaction gas, and reacts in the region of the at least one molybdenum target with the sputtered molybdenum, which is a nitride-forming element, and is deposited on the substrate as a first nanolayer of molybdenum nitride MoN.

The substrate is then rotated by the substrate holder in the direction of the at least one copper target, and a second nanolayer of copper Cu is deposited on the first nanolayer of MoN which has been formed, so that a first functional layer is completed. In order to apply further functional layers, the substrate is then further rotated by the substrate holder in the direction of the at least one molybdenum target, and a further first nanolayer of MoN is formed on the second nanolayer of copper which has been formed. The substrate is rotated by the substrate holder again in the direction of the at least one copper target, and a further second nanolayer of copper is deposited on the further first nanolayer of MoN which has been formed, so that a second functional layer is completed.

A sufficient number of further functional layers are then applied in the same way until a total layer thickness D of the layer system in the range of about 0.1 to 10 μm is reached. In this case, the rotational speed of the substrate holder has a direct effect on the layer thickness and the number of nanolayers. The higher the rotational speed selected, with deposition conditions otherwise remaining the same, the smaller the layer thickness of a nanolayer is and the higher the number n of nanolayers in the layer system is.

It is, however, also possible to use continuous sputtering systems in order to produce the layer system, in which the substrates are transported through a vacuum chamber in a continuous feed direction. In this case, the substrates may furthermore be rotated or turned about their longitudinal axis in addition to a movement in the continuous feed direction.

Some example layer systems will be described below:

| Layer System 1: | |
| --- | --- |
| First bonding layer: | chromium |
| Second bonding layer: | chromium, molybdenum |
| Functional layer: | first nanolayer: MoN |
| | second nanolayer: Cu |

The functional layer is in this case present at least 10 times.

| Layer System 2: | |
| --- | --- |
| First bonding layer: | chromium |
| Second bonding layer: | chromium, niobium |
| Functional layer: | first nanolayer: NbN |
| | second nanolayer: Cu |

The functional layer is in this case present at least 10 times.

| Layer System 3: | |
| --- | --- |
| First bonding layer: | chromium |
| Second bonding layer: | chromium, titanium |
| Functional layer: | first nanolayer: TiN |
| | second nanolayer: Cu |

The functional layer is in this case present at least 10 times.

| Layer System 4: | |
| --- | --- |
| First bonding layer: | chromium |
| Second bonding layer: | chromium, tantalum |
| Functional layer: | first nanolayer: TaN |
| | second nanolayer: Cu |

The functional layer is in this case present at least 10 times.

| Layer System 5: | |
|---|---|
| First bonding layer: | chromium |
| Second bonding layer: | chromium, zirconium |
| Functional layer: | first nanolayer: ZrN |
| | second nanolayer: Cu |

The functional layer is in this case present at least 10 times.

| Layer System 6: | |
|---|---|
| First bonding layer: | chromium nitride |
| Second bonding layer: | chromium, zirconium |
| Functional layer: | first nanolayer: ZrN |
| | second nanolayer: Pd |

The functional layer is in this case present at least 10 times.

| Layer System 7: | |
|---|---|
| First bonding layer: | chromium nitride |
| Second bonding layer: | chromium, molybdenum |
| Functional layer: | first nanolayer: MoN |
| | second nanolayer: Ag |

The functional layer is in this case present at least 100 times.

| Layer System 8: | |
|---|---|
| First bonding layer: | titanium |
| Second bonding layer: | titanium, molybdenum |
| Functional layer: | first nanolayer: MoN |
| | second nanolayer: Au |

The functional layer is in this case present at least 100 times.

| Layer System 9: | |
|---|---|
| Bonding layer: | molybdenum |
| Functional layer: | first nanolayer: MoN |
| | second nanolayer: Cu |

The functional layer is in this case present at least 10 times.

| Layer System 10: | |
|---|---|
| First bonding layer: | titanium nitride |
| Second bonding layer: | titanium, molybdenum |
| Functional layer: | first nanolayer: MoN |
| | second nanolayer: Ir |

The functional layer is in this case present at least 10 times.

BRIEF DESCRIPTION OF THE DRAWINGS

The layer system according to the disclosure and a component in the form of a substrate at least partially coated therewith will be explained by way of example by means of FIGS. 1 and 2.

DETAILED DESCRIPTION

Figure 1:
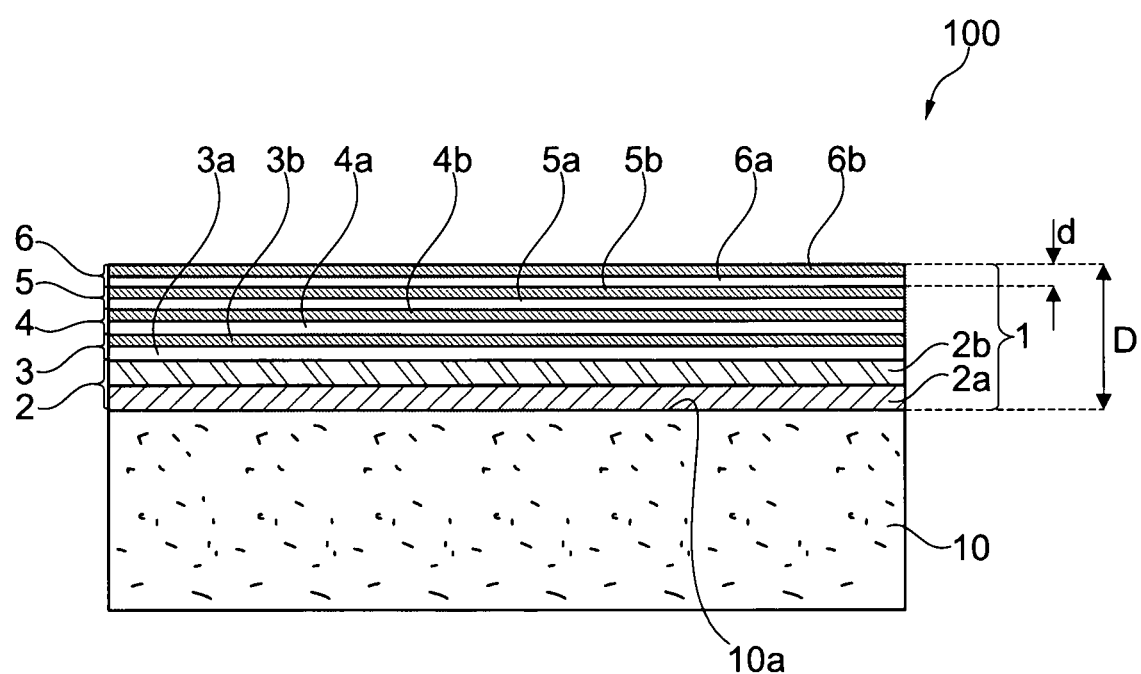
FIG. 1 shows a component having a layer system.

FIG. 1 shows a component 100 having a layer system 1, which is applied onto part of a surface 10a of a substrate 10. The substrate 10 is in this case formed from steel. The layer system 1 comprises, starting from the surface 10a of the substrate 10, a bonding layer 2 which comprises a first bonding layer 2a of chromium and a second bonding layer 2b of chromium and molybdenum. The chromium content of the second bonding layer 2b follows a gradient and decreases starting from the first bonding layer 2a in the direction of the functional layers 3, 4, 5, 6. Here, for the sake of clarity, only four of the provided number n=15 functional layers are represented.

Applied on the second bonding layer 2b, there is a first functional layer 3 which comprises a first nanolayer 3a of molybdenum nitride MoN and a second nanolayer 3b of copper Cu thereon. Applied on the first functional layer 3, there is a second functional layer 4 which likewise comprises a first nanolayer 4a of MoN and a second nanolayer 4b of Cu thereon. Applied on the second functional layer 4, there is a third functional layer 5 which likewise comprises a first nanolayer 5a of MoN and a second nanolayer 5b of Cu thereon. Applied on the third functional layer 5, there is a fourth functional layer 6 which likewise comprises a first nanolayer 6a of MoN and a second nanolayer 6b of Cu thereon.

The total layer thickness D of the layer system 1 is in this case 0.5 μm. The layer thickness of each functional layer 3, 4, 5, 6 is in this case 15 nm, each first nanolayer 3a, 4a, 5a, 6a having a layer thickness of about 10 nm and each second nanolayer 3b, 4b, 5b, 6b having a layer thickness of about 5 nm.

Figure 2:
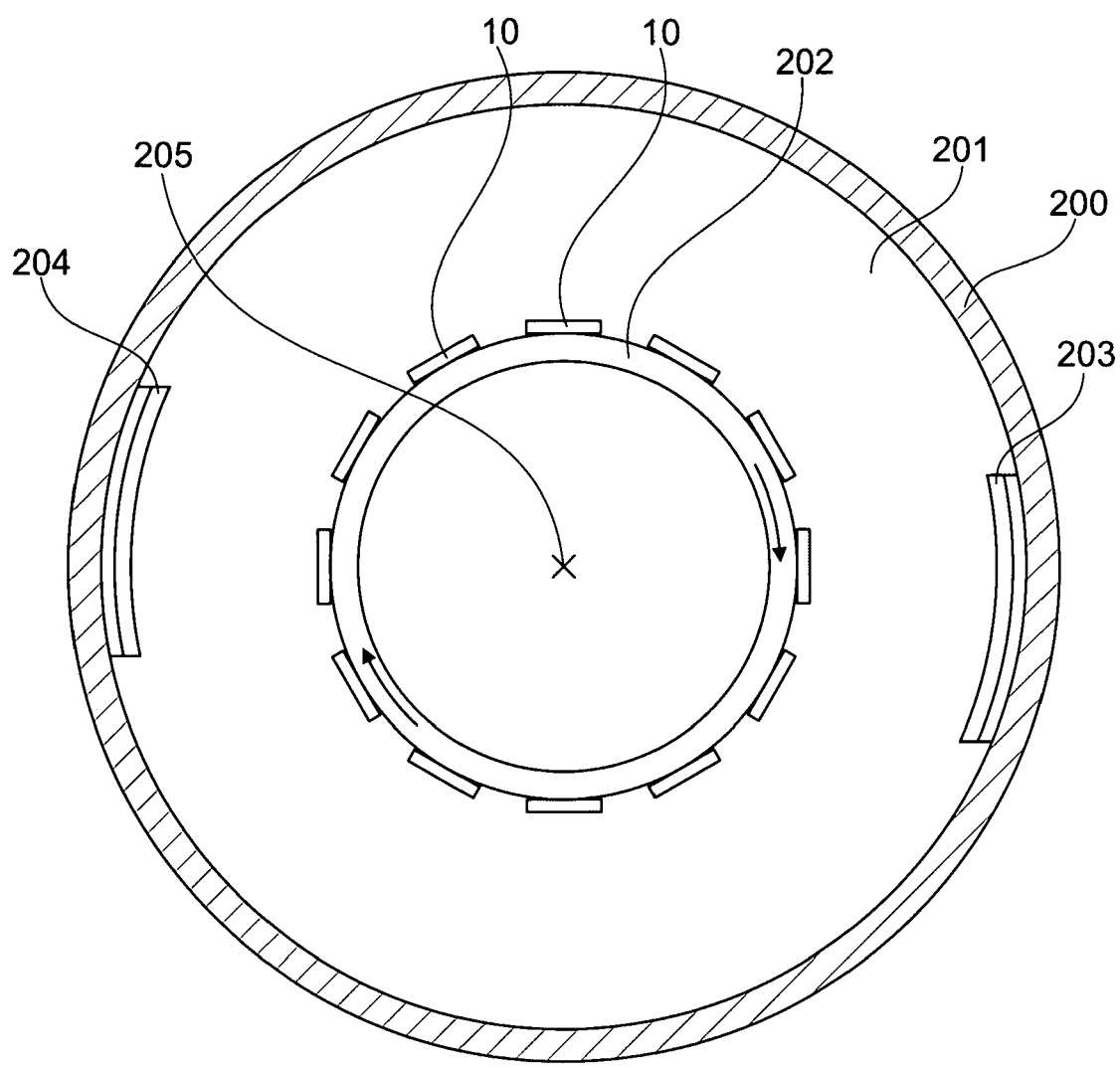
FIG. 2 shows an apparatus for forming the first layer system on a substrate in cross section in plan view.

FIG. 2 shows merely by way of example and schematically an apparatus for forming the layer system 1 according to FIG. 1 on the substrate in cross section and in plan view. The apparatus is represented merely schematically and comprises a vacuum container 200 having a vacuum chamber 201, in which a substrate holder 202 is arranged. The substrate holder 202 is configured in the form of a hollow cylinder rotatable about a vertical axis 205 (see the arrows for marking the rotation direction in FIG. 2), on the outer side of which a multiplicity of substrates 10 are fastened. Targets 203, 204 are arranged in the vacuum chamber 201 on mutually opposite side walls of the vacuum container 200.

The target 203 is at least one molybdenum target for sputtering molybdenum and forming the first nanolayers 3a, 4a, 5a, 6a (cf. FIG. 1), while the further target 204 is at least one copper target for sputtering copper and forming the second nanolayers 3b, 4b, 5b, 6b. A reduced pressure is set up in the vacuum chamber 201, an atmosphere containing nitrogen as reaction gas being present. During the sputtering, the molybdenum of the target 203 is sputtered and reacts with the nitrogen in the vacuum chamber 201.

A first nanolayer 3a, 4a, 5a, 6a of MoN is deposited on the substrates 10, which are respectively located between the target 203 and the substrate holder 202 during rotation of the substrate holder 202. Because of the rotation of the substrate holder 202, the substrates 10 coated with the first nanolayer 3a, 4a, 5a, 6a are then transported in the direction of the target 204 until they are located between the target 204 and the substrate holder 202. The second nanolayer 3b, 4b, 5b, 6b is then formed on the first nanolayer 3a, 4a, 5a, 6a. By further rotation of the substrate holder 202, further application of further functional layers is carried out, until the desired number n of functional layers is reached.

REFERENCE NUMERALS 1 layer system
2 bonding layer
2a first bonding layer
2b second bonding layer
3, 4, 5, 6 functional layer
3a, 4a, 5a, 6a first nanolayer
3b, 4b, 5b, 6b second nanolayer
10 substrate
10a surface of the substrate
100 component
200 vacuum container
201 vacuum chamber
202 substrate holder
203 target
204 target
205 vertical axis
n number of functional layers
d layer thickness of a functional layer
D total layer thickness of the layer system

The invention claimed is:

1. A layer system, comprising:
at least one bonding layer; and,
n functional layers arranged on the at least one bonding layer, wherein:
each functional layer comprises:
a first nanolayer of a first metal nitride comprising a first metal constituent, the first metal nitride being formed by molybdenum nitride MoN; and,
a metallic second nanolayer; and
each functional layer has a layer thickness d in a range of 1 to 100 nm, wherein:
the metallic second nanolayer is formed from at least one metal selected from the group consisting of palladium, platinum, and iridium; and
a number of n functional layers is selected in a range of 10 to 10000.

2. The layer system of claim 1, wherein the at least one bonding layer comprises a first bonding layer comprising:
a further metal; or,
a second metal nitride comprising a second metal constituent.

3. The layer system of claim 2, wherein the at least one bonding layer comprises a second bonding layer comprising:
the first metal constituent of the first metal nitride; and,
the further metal; or
the second metal constituent of the second metal nitride.

4. The layer system of claim 3, wherein the first bonding layer, the second bonding layer, and the n functional layers are arranged successively.

5. The layer system of claim 1 further comprising a total layer thickness D in a range of 0.1 µm to 10 µm.

6. The layer system of claim 1, wherein:
the first nanolayer is thicker than the metallic second nanolayer.

7. The layer system of claim 1, wherein the plurality of functional layers has an average content of metal of the metallic second nanolayer in the range of from 0.1 to 20 At.-%.

8. The layer system of claim 1, wherein the layer system is formed by a PVD method at temperatures below 350° C.

9. The layer system of claim 1, wherein the layer system has a Vickers hardness in a range of 1000 to 4000 HV.

10. A component comprising:
a metallic substrate; and,
the layer system of claim 1 at least partially arranged on a surface of the metallic substrate, wherein the at least one bonding layer is arranged adjacent to the metallic substrate.

11. The component of claim 10, wherein the metallic substrate is formed from steel.

12. The component of claim 10, wherein the component is configured as a barrel tappet, a chain part, a rolling bearing part, a control piston, a bearing bush, a towing lever, a roller tappet part or a slide bearing part.

13. The component of claim 10 wherein the at least one bonding layer has a layer thickness in the range of 0.01 µm to 2 µm.

14. The component of claim 10 wherein the at least one bonding layer comprises chromium.

* * * * *